United States Patent
Ho et al.

(10) Patent No.: US 7,954,018 B2
(45) Date of Patent: May 31, 2011

(54) ANALYSIS TECHNIQUES FOR MULTI-LEVEL MEMORY

(75) Inventors: Tom T. Ho, San Carlos, CA (US); Jonathan B. Buckheit, Los Altos, CA (US); Weidong Wang, Union City, CA (US)

(73) Assignee: Rudolph Technologies, Inc, Flanders, NJ (US)

( * ) Notice: Subject to any disclaimer, the term of this patent is extended or adjusted under 35 U.S.C. 154(b) by 584 days.

(21) Appl. No.: 11/701,700

(22) Filed: Feb. 2, 2007

(65) Prior Publication Data

US 2008/0189582 A1 Aug. 7, 2008

(51) Int. Cl.
*G11C 29/00* (2006.01)

(52) U.S. Cl. ........ 714/718; 714/720; 714/721; 714/723; 365/201

(58) Field of Classification Search .......... None
See application file for complete search history.

(56) References Cited

U.S. PATENT DOCUMENTS

| | | | | |
|---|---|---|---|---|
| 6,058,495 A * | 5/2000 | Lee et al. | ....... | 714/718 |
| 6,470,229 B1 | 10/2002 | Wang et al. | ....... | 700/121 |
| 6,519,725 B1 * | 2/2003 | Huisman et al. | ....... | 714/718 |
| 6,701,477 B1 * | 3/2004 | Segal | ....... | 714/732 |
| 6,795,942 B1 * | 9/2004 | Schwarz | ....... | 714/718 |
| 6,950,771 B1 * | 9/2005 | Fan et al. | ....... | 702/117 |
| 7,075,822 B2 | 7/2006 | Elmhurst et al. | ....... | 365/185.03 |
| 7,370,251 B2 * | 5/2008 | Nadeau-Dostie et al. | .... | 714/723 |
| 2003/0140276 A1 * | 7/2003 | Sagatelian | ....... | 714/25 |
| 2007/0150777 A1 * | 6/2007 | Sasaki | ....... | 714/718 |
| 2007/0255982 A1 * | 11/2007 | Adsitt | ....... | 714/718 |
| 2008/0005630 A1 * | 1/2008 | Adsitt | ....... | 714/718 |

OTHER PUBLICATIONS

Redeker, M., et al., "Fault Modeling and Pattern-Sensitivity Testing for a Multilevel DRAM", IEEE 2002, 6 pgs.

* cited by examiner

*Primary Examiner* — Jeffrey A Gaffin
*Assistant Examiner* — Guerrier Merant
(74) *Attorney, Agent, or Firm* — Harrington & Smith

(57) ABSTRACT

A system and method for defect analysis of multi-level memory cell devices and embedded multi-level memory in system-on-chip integrated circuits are disclosed wherein a defect data set is input into the system. When a defect data set is received, an automated test engineering system running a memory test program analyzes the defect data set to generate one or more fail bit locations and one or more fail states of the memory. The multi-level memory defect analysis system and method then classify failed bits or patterns comprising a vertical fail pattern, whereby after being classified, each memory cell failure vertical fail pattern has three data attributes comprising fail type, a number of fail bits/states, and a sequence of the fail states. The vertical fail pattern may comprise a single fail state or multi-state fail. The multi-state fail may be a continuous-states fail, discontinuous-states fail, or all-state fail. The multi-level memory defect analysis system and method may additionally enable classification of failed bits or patterns comprising a lateral fail pattern. The lateral fail pattern may be a gradual fail pattern, periodic fail pattern, or random fail pattern.

29 Claims, 5 Drawing Sheets

| 4 | 4 | 4 | 4 | 4 | 4 | 4 | 4 | 4 |
|---|---|---|---|---|---|---|---|---|
| 4 | 3 | 3 | 3 | 3 | 3 | 3 | 3 | 4 |
| 4 | 3 | 2 | 2 | 2 | 2 | 2 | 3 | 4 |
| 4 | 3 | 2 | 1 | 1 | 1 | 2 | 3 | 4 |
| 4 | 3 | 2 | 1 | 0 | 1 | 2 | 3 | 4 |
| 4 | 3 | 2 | 1 | 1 | 1 | 2 | 3 | 4 |
| 4 | 3 | 2 | 2 | 2 | 2 | 2 | 3 | 4 |
| 4 | 3 | 3 | 3 | 3 | 3 | 3 | 3 | 4 |
| 4 | 4 | 4 | 4 | 4 | 4 | 4 | 4 | 4 |

| 1 | 1 | 1 | 1 | 1 | 1 | 1 | 1 | 1 |
|---|---|---|---|---|---|---|---|---|
| 1 | 2 | 2 | 2 | 2 | 2 | 2 | 2 | 1 |
| 1 | 2 | 2 | 2 | 2 | 2 | 2 | 2 | 1 |
| 1 | 2 | 2 | 3 | 3 | 3 | 2 | 2 | 1 |
| 1 | 2 | 2 | 3 | 4 | 3 | 2 | 2 | 1 |
| 1 | 2 | 2 | 3 | 3 | 3 | 2 | 2 | 1 |
| 1 | 2 | 2 | 2 | 2 | 2 | 2 | 2 | 1 |
| 1 | 2 | 2 | 2 | 2 | 2 | 2 | 2 | 1 |
| 1 | 1 | 1 | 1 | 1 | 1 | 1 | 1 | 1 |

FIG. 5A.

| 1 | 2 | 3 | 1 | 2 | 3 | 1 | 2 | 3 |
|---|---|---|---|---|---|---|---|---|

| 1 | 2 | 1 | 2 | 1 | 2 | 1 | 2 |
|---|---|---|---|---|---|---|---|

FIG. 5B.

ANALYSIS TECHNIQUES FOR MULTI-LEVEL MEMORY

BACKGROUND OF THE INVENTION

1. Field of the Invention

The present invention relates generally to systems and methods for quality control of integrated circuits manufactured by a semiconductor manufacturing process and, more particularly, to a system and method for analyzing defects in multi-level memory cell devices and embedded multi-level memory in system-on-chip integrated circuits manufactured using a semiconductor fabrication process.

2. Description of the Prior Art

A standard memory cell typically stores one bit of information by storing one of two levels of electrical charge in its storage cell, namely, full charge or no charge. Newer memory devices, sometimes referred to as multi-level cell devices, can store more than one bit per cell, by storing two or more levels of electrical charge per memory cell.

Traditionally, with standard memory cell analysis, one would analyze the failed memory cells by assigning each cell to be a failed cell or a passed cell (binary mode). An analysis tool then can classify the failed bit cells by a variety of techniques such as displaying the failed bits in a rectangular grid with X and Y coordinates with different coloring schemes, grouping and classifying the failed bits into bitmap "signatures" or "patterns," aggregating and grouping the fail signatures and/or failed bits into classes of fails, correlating the failed bits with fabrication defects, etc. The occurrence of defects may cause lower yield in the final memory cell product, where yield may be defined as the number of functional memory cell devices produced by the process as compared to the theoretical number of devices that could be produced assuming no bad devices.

Improving yield is a critical issue in the semiconductor manufacturing industry. Higher yield translates into more devices that may be sold by the manufacturer, and thus greater profits.

Considered in more detail, typically, semiconductor manufacturers collect and analyze data about various defects in memory cell devices. Based on data analysis, they adjust the memory cell device design and/or process steps and/or tool specifications in an attempt to improve the yield of the process. This has created a need for a new generation of tools and techniques for defect analysis for memory cell yield management.

U.S. Pat. No. 6,470,229 B1 assigned to the same assignee as the present application discloses a yield management system and technique to generate a yield model. The system can also accept user input to modify the generated model.

Additionally, a Genesis™ Bitmap Analysis product module is commercially available from the assignee of U.S. Pat. No. 6,470,229 B1 to extend the capabilities of the yield management system to direct bitmap-level analysis of standard memory cells. The Bitmap Analysis product module suite allows a user to graph and analyze bitmap data. Bit failures are revealed to the user visually with interactive bitmaps. Analysis is performed on classified bitmap pattern information imported into a data sheet. Bitmap patterns may consist of single-bit failures, dual bits, rows, columns, or any complex pattern. A general instance of a failure is described internally preferably using a list of one or more bounding rectangles to specify the set of bits that failed. Each bounding rectangle is specified by the bit coordinates of the lower-left and upper-right corners of the rectangle.

Information on each of a die's bit failures can be viewed by toggling an "N of (total number of bit fails)" list in a Bit-Fail Browser. The following information may be displayed for each bit failure:

Array—the array where the bit failure occurred.
Block—the block where the bit failure occurred.
Pattern—the bit-fail pattern associated with the bit failure. If the bit failure is not associated with a defined bit-fail pattern, this field will be grayed out.
Bit Count—this field specifies the total number of bits that failed in the defined rectangle associated with the bit-fail pattern. The rectangle is defined by Array, Block, and logical coordinates (X0, Y0) and (X1, Y1).
Sub-Pattern—the index of the bounding rectangle(s) in the bit-fail pattern. Each sub-pattern has a range.
Range—the X0, X1, Y0, and Y1 coordinates describe the lower-left corner (X0, Y0) and the upper-right corner (X1, Y1) of the bounding rectangle associated with the current sub-pattern. These coordinates are in units of bits from the lower-left corner of the array/block.
Match—if this option is checked by a user, the bit failure has been matched to a known defect.
Reticle Repeater—if this option is checked by the user, the bit failure is repeating on the same reticle.

An enhanced Genesis™ Bitmap Analysis product module is also commercially available from the assignee of U.S. Pat. No. 6,470,229 B1 to extend the capabilities of the yield management system to direct bitmap-level analysis clustering. When defining a bit cluster pattern, a user has the following options: 1) selecting a radius specified by a number of "good" bits away from another failed bit before the current fail bit can be classified as part of the original bit cluster; 2) selecting a minimum count of failed bits in a bit cluster; and 3) selecting a maximum count of failed bits in a bit cluster. The bit clustering and aggregation system may then receive a defect data set. When a defect data set is received, the bit clustering and aggregation system starts with a failed bit and searches for neighboring failed bits. The bit clustering and aggregation system uses the specified radius to qualify the found failed bits to be part of the cluster or not. If the minimum count of failed bits is not met, the bit clustering and aggregation system will stop searching and move to the next failed bit. If the minimum count of failed bits is met, the bit clustering and aggregation system will continue to search for the next failed bit until it reaches the maximum fail bit count specified by the user. Aggregation is provided such that once clusters have been classified, the number of clusters that have the exact match or partial match to each other is counted.

In multi-level memory cell devices, each bit cell can contain more than two levels. With these additional levels, different failure mechanisms of the bit cell can now occur, which requires different analysis techniques to identify these failure mechanisms.

Thus, it would be desirable to provide a defect analysis system and method which overcome the above limitations and disadvantages of conventional systems and facilitate analysis of multi-level memory cell devices and embedded multi-level memory in system-on-chip integrated circuits leading to more effective quality control. It is to this end that the present invention is directed. The various embodiments of the system and method for analysis of multi-level memory in accordance with the present invention address the aforementioned problems and provide many advantages over conventional defect analysis systems and techniques.

SUMMARY OF THE INVENTION

One embodiment of the system and method for analysis of multi-level memory cell devices and embedded multi-level memory in system-on-chip integrated circuits in accordance with the present invention provides many advantages over conventional analysis systems and techniques, which make the multi-level memory defect analysis system and method in accordance with the present invention more useful to semiconductor manufacturers. The multi-level memory defect analysis system and method in accordance with the various embodiments of the present invention identify random and systematic failure mechanisms. The system may be fully automated and is easy to use, so that no extra training is necessary to make use of the multi-level memory defect analysis system. The system generates an output preferably in the form of a failed bit analysis report that is easy to interpret and understand.

In accordance with one preferred embodiment of the present invention, a system and method for analyzing defects in multi-level memory cell devices and embedded multi-level memory in system-on-chip integrated circuits manufactured using a semiconductor fabrication process are provided. One embodiment of the multi-level memory defect analysis system and method in accordance with the present invention may receive a defect data set from a memory tester that extracts bits from memory chips. When a defect data set is received, an automated test engineering system running a memory test program analyzes the defect data set to generate one or more fail bit locations and one or more fail states of the memory. The multi-level memory defect analysis system and method in accordance with one embodiment of the present invention then classify failed bits or patterns comprising a vertical fail pattern, whereby after being classified, each memory cell failure vertical fail pattern has three data attributes comprising fail type, a number of fail bits/states, and a sequence of the fail states. The vertical fail pattern may comprise a single fail state or multi-state fail. The multi-state fail may be a continuous-states fail, discontinuous-states fail, or all-state fail. The multi-level memory defect analysis system and method in accordance with another embodiment of the present invention also preferably enable classification of failed bits or patterns comprising a lateral fail pattern. The lateral fail pattern may comprise a gradual fail pattern, periodic fail pattern, or random fail pattern. Preferably, the multi-level memory defect analysis system and method generate a defect analysis report of failed bits or patterns and/or display failed bits or patterns. The multi-level memory defect analysis system and method in accordance with various embodiments of the present invention may generate a three-dimensional classification, produce a correlation, provide zonal analysis of memory blocks, reconfigure memory device capacity, and implement redundancy. The correlation provides correlation of defects to fail bits/patterns, correlation of Wafer Electrical Test or Wafer Acceptance Test data to fail bits/patterns, correlation of sort parametric data to fail bits/patterns, or correlation of in-line measurement data to fail bits/patterns. The multi-level memory defect analysis system and method in accordance with the present invention provide a defect analysis tool for analysis of multi-level memory cell devices and embedded multi-level memory in system-on-chip integrated circuits that is more powerful and flexible than conventional tools.

The foregoing and other objects, features, and advantages of the present invention will become more readily apparent from the following detailed description of various embodiments, which proceeds with reference to the accompanying drawing.

BRIEF DESCRIPTION OF THE DRAWING

The various embodiments of the present invention will be described in conjunction with the accompanying figures of the drawing to facilitate an understanding of the present invention. In the figures, like reference numerals refer to like elements. In the drawing:

FIG. 5, comprising FIGS. 5A and 5B, illustrates failed bits displayed by one embodiment of the multi-level memory defect analysis system and method of the present invention; and FIG. 6, comprising

DETAILED DESCRIPTION OF THE PREFERRED EMBODIMENTS

The present invention is particularly applicable to a computer-implemented software-based defect analysis system and method for multi-level memory cell devices and embedded multi-level memory in system-on-chip integrated circuits, and it is in this context that the various embodiments of the present invention will be described. It will be appreciated, however, that the multi-level memory defect analysis system and method in accordance with the present invention have greater utility, since they may be implemented in hardware or may incorporate other modules or functionality not described herein.

Figure 1:
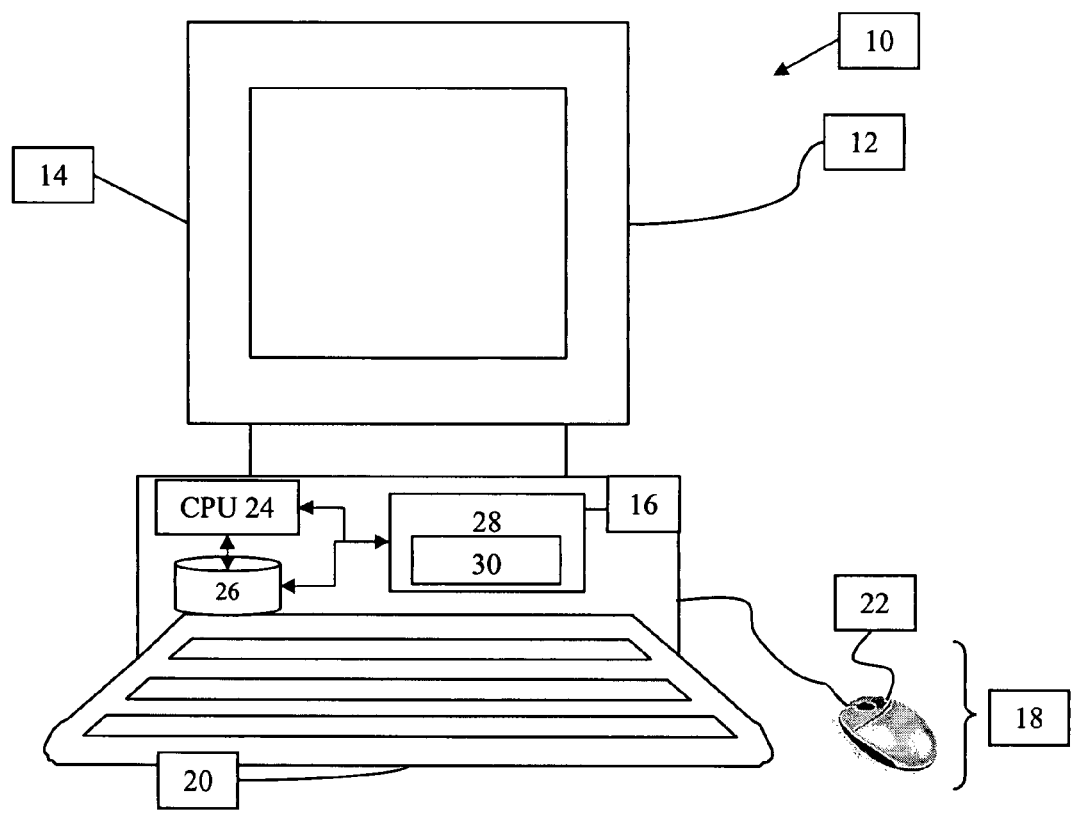
FIG. 1 is a diagram illustrating an example of a multi-level memory defect analysis system in accordance with one embodiment of the present invention implemented on a personal computer.

FIG. 1 is a block diagram illustrating an example of a multi-level memory defect analysis system 10 in accordance with one embodiment of the present invention implemented on a personal computer 12. In particular, the personal computer 12 may include a display unit 14, which may be a cathode ray tube (CRT), a liquid crystal display, or the like; a processing unit 16; and one or more input/output devices 18 that permit a user to interact with the software application being executed by the personal computer. In the illustrated example, the input/output devices 18 may include a keyboard 20 and a mouse 22, but may also include other peripheral devices, such as printers, scanners, and the like. The processing unit 16 may further include a central processing unit (CPU) 24, a persistent storage device 26, such as a hard disk, a tape drive, an optical disk system, a removable disk system, or the like, and a memory 28. The CPU 24 may control the persistent storage device 26 and memory 28. Typically, a software application may be permanently stored in the persistent storage device 26 and then may be loaded into the memory 28 when the software application is to be executed by the CPU 24. In the example shown, the memory 28 may contain a multi-level memory defect analyzer 30. The multi-level memory defect analyzer 30 may be implemented as one or more software applications that are executed by the CPU 24.

In accordance with the present invention, the multi-level memory defect analysis system 10 may also be implemented using hardware and may be implemented on different types of computer systems, such as client/server systems, Web servers, mainframe computers, workstations, and the like. Now, more details of an exemplary implementation of the multi-level memory defect analysis system 10 in software will be described.

Figure 2:
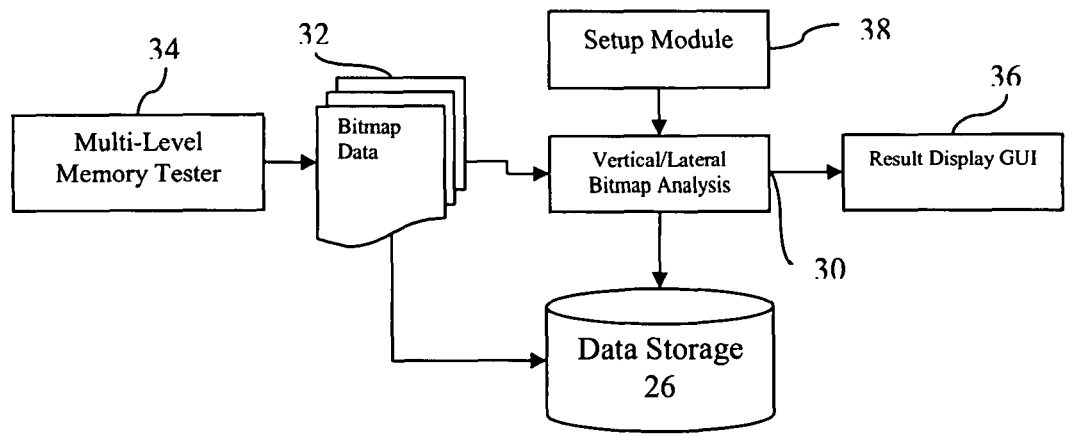
FIG. 2 is a block diagram illustrating more details of the multi-level memory defect analysis system in accordance with the embodiment of the present invention shown in FIG. 1.

FIG. 2 is block diagram illustrating more details of the multi-level memory defect analysis system 10 in accordance with one embodiment of the present invention. In particular, the multi-level memory defect analyzer 30 may receive a defect data set 32 containing various types of semiconductor process defect data of the particular multi-level memory cell device or embedded multi-level memory in a system-on-chip integrated circuit being inspected. For example, the data may be produced by a memory tester 34 that extracts bits from memory chips. The multi-level memory defect analyzer 30 may process the defect data set and generate a display 36 that may indicate, for example, the location of defects that affected the yield of the multi-level memory cell device or embedded multi-level memory in a system-on-chip integrated circuit that generated the current defect data set.

Considered in more detail, as shown in FIG. 2, the defect data set may be input to the multi-level memory defect analyzer 30 that analyzes the data and identifies defects. The user may preferably enter preferences using a setup module 38 to define the attributes of a defect analysis. Once the user preferences have been incorporated, an analysis of the defect data set may be automatically performed by the multi-level memory defect analyzer 30. The output of the multi-level memory defect analyzer 30 may be, for example, a listing of one or more failed bits that affect the yield of the multi-level memory cell device or embedded multi-level memory in a system-on-chip integrated circuit that generated the defect data set being analyzed. Now, a multi-level memory defect analysis method in accordance with various embodiments of the present invention will be described.

The multi-level memory defect analysis system and method in accordance with the various embodiments of the present invention are preferably used as a companion to the yield management system and technique disclosed in aforementioned U.S. Pat. No. 6,470,229 B1, the disclosure of which is hereby incorporated in its entirety herein by this reference. Brief descriptions of the primary functions of the yield management system and technique disclosed in aforementioned U.S. Pat. No. 6,470,229 B1, such as how to use preferences, set up and run analyses, and interpret results, will be summarized prior to describing using the multi-level memory defect analyzer 30.

Figure 3:
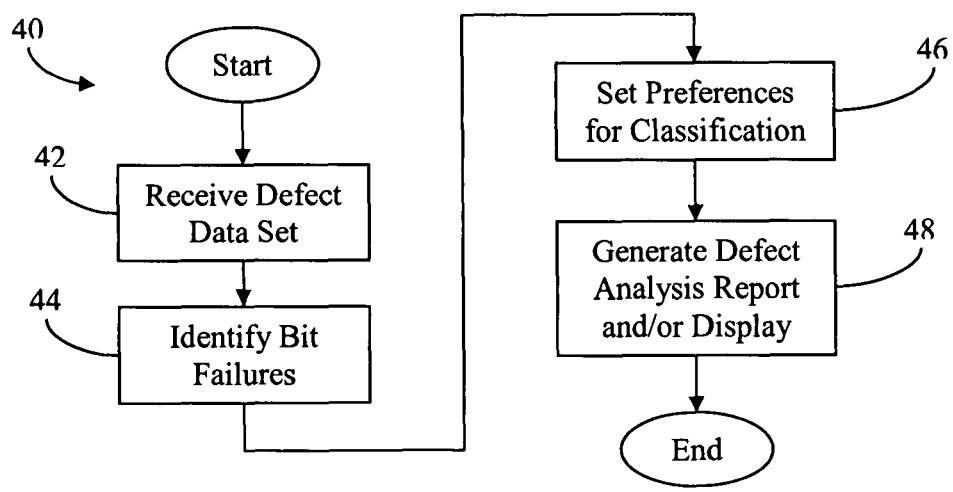
FIG. 3 is a flowchart illustrating an example of a multi-level memory defect analysis method in accordance with one embodiment of the present invention.

The multi-level memory defect analysis system and method in accordance with the preferred embodiment of the present invention preferably perform an analysis of defect data and generate a report or display of bit-fail data. FIG. 3 is a flowchart illustrating an example of a multi-level memory defect analysis method 40 in accordance one embodiment of the present invention. The method may include receiving a defect data set, as indicated by a step 42 shown in FIG. 3. As indicated by a step 44 shown in FIG. 3, the defect data set may be analyzed to identify bit failures. Once the analysis is complete, the method may include setting preferences for analysis of failures, as indicated by a step 46 shown in FIG. 3, and generating a report, for example, a defect analysis report and/or display, as indicated by a step 48 shown in FIG. 3. Each of the above steps will now be described in more detail to provide a better understanding of the multi-level memory defect analysis method in accordance with the various embodiments of the present invention. First, the defect data receiving step 42 in accordance with the method of the present invention will now be described.

In accordance with various embodiments of the present invention, one or more methods can be used to provide a defect data set according to step 42 and to help analyze the failed cells of a multi-level memory device or embedded multi-level memory in a system-on-chip integrated circuit according to step 44 shown in FIG. 3. By way of further background, external memory test programs from an automated test engineering (ATE) system will generate the fail bit location and the fail state of the memory. Examples of known ATE systems are described in U.S. Pat. No. 7,075,822.

The fail level of a failed memory cell can be either literally defined as failing level 0, level 1, etc., or it may be defined using a metric such that an experienced user can interpret and translate the failing metric into a failing level. For example, if the metric is output in current (i.e., Amperes), each passing level may be defined as a range of current such that a bit cell which fails level 0 means its measured current is not within the predefined current range. As will be appreciated by persons skilled in the art, from the measured metric and a set of definitions (or a deduced set of definitions), one can translate the measured metric to a bit cell state level.

After the failed memory cells have been identified in step 44, in accordance with various embodiments of the present invention, one or more analysis techniques for the failed cells can be employed dependent upon analysis of the failure mechanism according to step 46 shown in FIG. 3. Various embodiments for analysis are illustrated in the flowchart shown in FIG. 4.

One analysis method is to detect a fail pattern for multi-level memory. One fail pattern may be referred to as a "vertical fail pattern," as indicated by a step 50 shown in FIG. 4. That is, one memory bit requires two states. A multi-level memory cell can store multiple bits per cell. Thus, it must be able to store more than two states (or number of states=2× number of bits). Therefore, a multi-level memory cell can have more than one failed state. For the purposes of this description, the fail states within a cell are defined to be "vertical" fail states. They can be classified into one of four classes, as follows.

Figure 4:
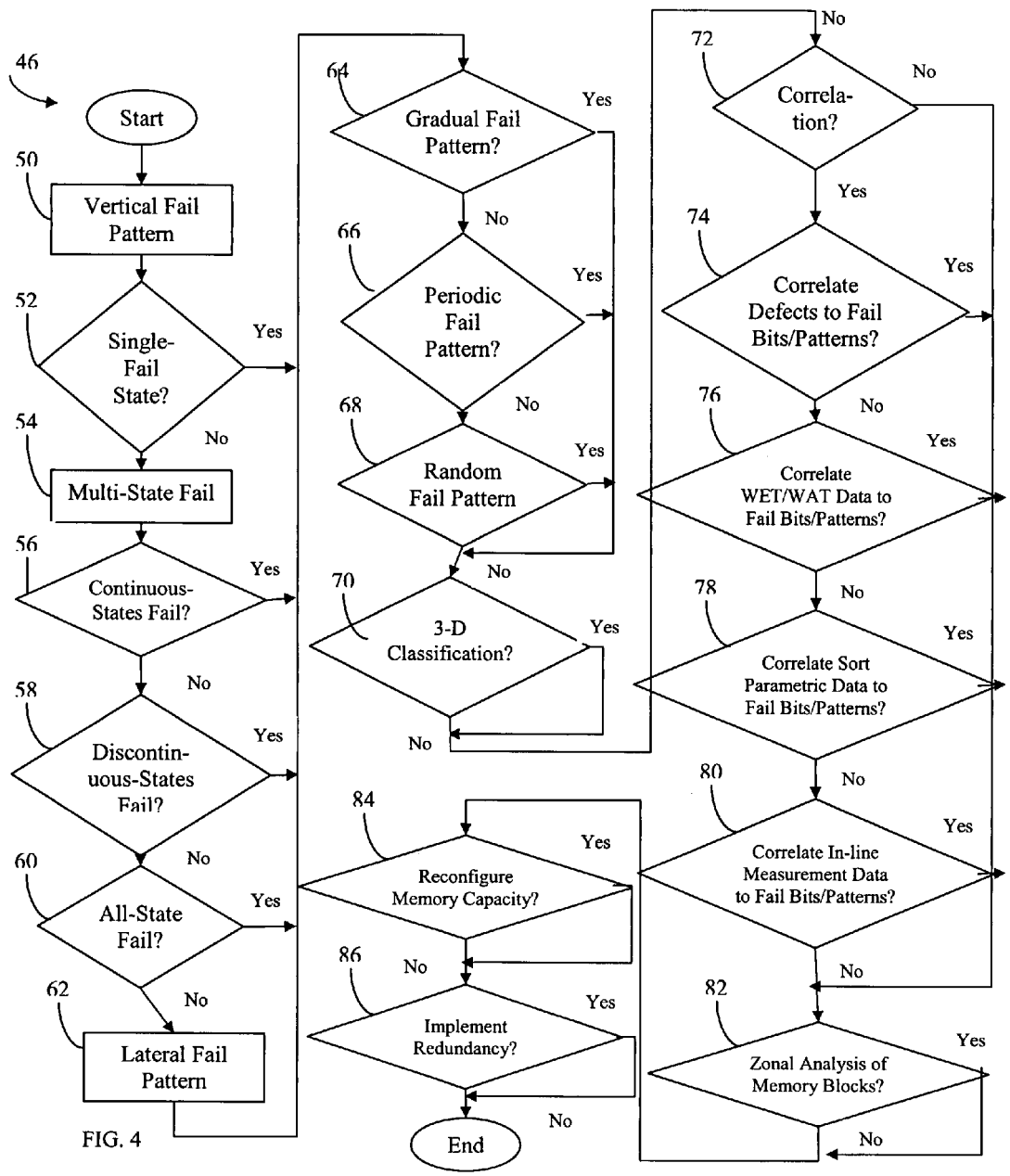
FIG. 4 is a flowchart illustrating analysis techniques according to the multi-level memory defect analysis method in accordance with one embodiment of the present invention.

The first vertical fail pattern may be referred to as "single state fail," as indicated by a step 52 shown in FIG. 4. Single state fail is defined as a memory cell that has only one fail state out of all available states in the cell.

The second vertical fail pattern may be referred to as "multi-state fail," as indicated by a step 54 shown in FIG. 4. Multi-state fail is defined as a memory cell that has more than one fail state in the cell and can be further classified into three classes, as follows.

The first multi-state fail class may be referred to as "continuous-states fail," as indicated by a step 56 shown in FIG. 4. Continuous-states fail is defined as a memory cell that has more than one fail state and the fail states are adjacent to each other. For example, a memory cell may have four binary states (i.e., two bits), say states 0, 1, 2, and 3. An example of a continuous-states fail would be any combination of adjacent failing states, such as state 0/1, state 2/3, state 0/1/2, state 1/2/3, etc.

The second multi-state fail class may be referred to as "discontinuous-states fail" or, alternatively, "mixed-states fail," as indicated by a step 58 shown in FIG. 4. Discontinuous- or mixed-states fail is defined as a memory cell that has more than one fail state and at least one of the fail states is not adjacent to at least one other fail state. For example, a memory cell has four binary states (i.e., two bits), say state 0, 1, 2, and 3. An example of a discontinuous-states or mixed-states fail would be any combination of failing states that includes at least one failure that is not adjacent to the other state(s), such as states 0/2, states 0/3, states 1/3, states 0/2/3, states 0/1/3, etc.

The third multi-state fail class may be referred to as "all-state fail," as indicated by a step 60 shown in FIG. 4. All-state fail is defined as a cell in which all states fail.

Accordingly, after being classified, each memory cell failure vertical fail pattern has three data attributes, namely:
1. Fail type:
    a. S=single state fail
    b. C=continuous multi-states fail
    c. D=discontinuous or mixed multi-states fail
    d. A=all states fail
2. The number fail bits/states
3. The sequence of the fail states A second fail pattern may be referred to as a "lateral fail pattern" (geometric classification (two-dimensional) of the resulting vertical fail), as indicated by a step 62 shown in FIG. 4. Considered in more detail, after memory cells have been classified into any of the four classes of fail type described above, they can be further classified into patterns (i.e., as a group of cells). With multi-level memory cells, some unique patterns can arise and may provide insights into the root causes of the failed cells.

One lateral fail pattern is referred to as a "gradual fail pattern," as indicated by a step 64 shown in FIG. 4. A gradual fail pattern occurs when a group of failed memory cells exhibits a gradual growth in number of failed bits within these cells with respect the X and Y coordinate directions (i.e., the lateral direction). Examples of a gradual fail pattern in which each square represents one memory cell and the number within the square represents the number of failed bits within that cell are shown in FIG. 5A. The analysis algorithm detects a gradual change in the number of vertical failing bits.

Another lateral fail pattern is referred to as a "periodic fail pattern," as indicated by a step 66 shown in FIG. 4. A periodic fail pattern has a repeating sequence in its pattern. Two examples of periodic fail pattern are shown in FIG. 5B.

A further lateral fail pattern is referred to as a "random fail pattern," as indicated by a step 68 shown in FIG. 4. A random fail pattern has a nonrecurring pattern of failed bits.

The multi-level memory defect analysis system and method in accordance with one embodiment of the present invention may provide a three-dimensional (3-D) classification of the failed bits, as indicated by a step 70 shown in FIG. 4. Because each memory cell now has a count of fail states, the cell can be represented as the third dimension in a geometric classification of the failed bits. A 3-D classification of the failed bits can help an engineer better visualize the failed bits, thereby enhancing the search for the root cause of the failure mechanism.

The multi-level memory defect analysis system and method in accordance with another embodiment of the present invention provide correlation of any measured parameters to the multi-level fail patterns, as indicated by a step 72 shown in FIG. 4. Because the location(s) of the failed bit(s) is(are) known, one may do many different spatial and/or statistical correlations with other data sources. Described below are examples of data sources that may be used to correlate with the failed bits.

One example is correlating defects to fail bits/patterns, as indicated by a step 74 shown in FIG. 4. Fabrication defect data are typically available from a fab defect inspection system, such as a KLA Tencor defect inspection system. Because the failed bit location(s) is(are) known, the failed bit data may be used to correlate with the fab defect locations to help determine which defect may be the cause of the failed bits and thus help narrow the investigation of the cause of the failed bits.

Another example is correlating Wafer Electrical Test (WET) or Wafer Acceptance Test (WAT) data to fail bits/patterns, as indicated by a step 76 shown in FIG. 4. WET is an electrical test to assess the health of a finished wafer. This test helps to determine whether the wafer was correctly fabricated or not. The WET test is typically performed on a number of sites on a wafer. Correlating the WET test results to the failed bits/patterns can help determine whether certain electrical parameters may have any influence on the failed bits.

Yet another example is correlating sort parametric data to fail patterns, as indicated by a step 78 shown in FIG. 4. Sort parametric data are electrical measurements of the die at a wafer sort step. Similar to the above-described correlations, these data can be used to correlate spatially and/or statistically to the failed bits/patterns to determine whether certain sort parameters may have any influence on the failed bits.

A further example is correlating in-line measurements to fail bits/patterns, as indicated by a step 80 shown in FIG. 4. In-line measurements are physical and electrical measurements that are performed on the wafers during the manufacturing of the wafers. Typical examples of in-line measurements are critical line dimensions of the circuits, thicknesses of deposited films, electrical resistivity of the deposited films, etc. In-line measurement data may be used to correlate spatially and/or statistically to the failed bits/patterns to determine whether certain in-line parameters may have any influence on the failed bits.

Another embodiment of the multi-level memory defect analysis system and method in accordance with the present invention provides zonal analysis of memory blocks, as indicated by a step 82 shown in FIG. 4. A zonal analysis, in which a wafer or a die can be partitioned into different sections, can be performed to compare and determine how the failed bits/patterns are distributed across the sections.

A further embodiment of the multi-level memory defect analysis system and method in accordance with the present invention uses failed bits test results to reconfigure memory device capacity, as indicated by a step 84 shown in FIG. 4. Because the multi-level memory cells can hold multiple bits, it is possible that if certain bits are not sufficiently reliable or fully functional, the manufacturer may decide to disregard these marginal bits and reconfigure the device to have only fully functional and reliable bits. This would enable the manufacturer to sell these memory devices at a lower bit count capacity, rather than scrapping the entire device at a total loss.

Another embodiment of the multi-level memory defect analysis system and method in accordance with the present invention implements redundancy, as indicated by a step 86 shown in FIG. 4. For example, one embodiment of redundancy reserves high states to be used as replacements for failed bits. Thus, if certain bits failed other than the high states, it is technically possible to replace these failed bits with these reserved redundant bits from other functional memory cells. Again, the memory cell device may need to be reconfigured to a lower overall capacity, but it can be sold at a lower price rather than scrapped at a total loss. In this embodiment, the reserved extra bits may be used as redundancy bits.

Figure 6A:
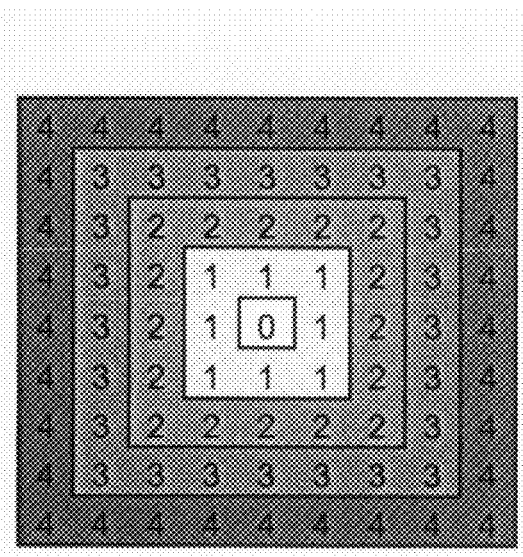
FIGS. 6A and 6B, illustrates failed bits displayed by another embodiment of the multi-level memory defect analysis system and method of the present invention.
Figure 6B:
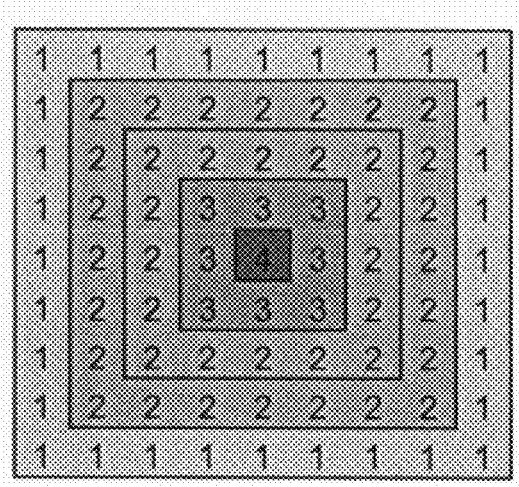

Referring again to FIG. 3, in accordance with various embodiments of the multi-level memory defect analysis system and method of the present invention, the failed bit information may be assembled to provide a defect analysis report and/or displayed in one or more formats, as indicated by step 48. In one embodiment of the multi-level memory defect analysis system and method of the present invention, an intensity map may be displayed using the vertical and lateral fail information. A display with gradient color can be used to show the intensity of the failures. FIGS. 6A and 6B show two examples using color to signify the fail intensity. Preferably, the start and end color can be set by the user.

In another contemplated embodiment of the multi-level memory defect analysis system and method of the present invention, a contour map may be displayed. Because each failed cell has vertical fail information and can be used to set to a color, the user can visualize contours of memory cells that have similar or the same vertical failure counts. These contour lines and maps are useful for the user to identify low and high fail regions based on the colors. These color patterns, which may form unique signatures or patterns, can in turn help the user determine the root cause of the failure(s).

While the foregoing description has been with reference to particular embodiments of the present invention, it will be appreciated by those skilled in the art that changes in these embodiments may be made without departing from the principles and spirit of the invention, the scope of which is defined by the appended claims.

What is claimed is:

1. A multi-level memory defect analysis system to analyze failed bits in multi-level memory cell devices and embedded multi-level memory in system-on-chip integrated circuits, comprising:
   a memory tester that tests multi-level memory cells from memory chips to provide a defect data set that includes one or more failed bits, wherein each multi-level memory cell stores an energy level representing two or more bits, each bit comprising two states; and
   a computer configured:
      to analyze the defect data set to generate, for each failed multi-level memory cell, a failed bit location and one or more fail states for the failed bit; and
      to classify a vertical fail pattern that indicates for each multi-level memory cell which of each of the two states for each bit of the multi-level memory cell comprises a fail state;
   whereby after being classified, each vertical fail pattern has three data attributes comprising a vertical fail pattern class, a number of failed bits or a number of fail states, and a sequence of the fail states.

2. The system of claim 1 wherein the computer is further configured to generate a defect analysis report of the one or more failed bits.

3. The system of claim 1 wherein the computer is further configured to display the one or more failed bits.

4. The system of claim 1 wherein the vertical fail pattern comprises one of a single state fail and multi-state fail.

5. The system of claim 4 wherein the multi-state fail is one of a continuous-states fail, discontinuous-states fail, and all-state fail.

6. The system of claim 1 wherein the computer is further configured to classify, for the one or more failed bits, a lateral fail pattern.

7. The system of claim 6 wherein the lateral fail pattern comprises one of a gradual fail pattern, periodic fail pattern, and random fail pattern.

8. The system of claim 1 wherein the computer is further configured to generate a three-dimensional classification.

9. The system of claim 1 wherein the computer is further configured to produce a correlation.

10. The system of claim 9 wherein the correlation provides at least one of
    correlation of defects to the one or more failed bits,
    correlation of Wafer Electrical Test or Wafer Acceptance Test data to the one or more failed bits,
    correlation of sort parametric data to the one or more failed bits, and
    correlation of in-line measurement data to the one or more failed bits.

11. The system of claim 1 wherein the computer is further configured to provide zonal analysis of memory blocks.

12. The system of claim 1 wherein the computer is further configured to reconfigure memory device capacity.

13. The system of claim 1 wherein the computer is further configured to implement redundancy.

14. A method for performing multi-level memory defect analysis to analyze failed bits in multi-level memory cell devices and embedded multi-level memory in system-on-chip integrated circuits, comprising:
    receiving a defect data set that includes one or more failed bits of at least one memory chip comprising multi-level memory cells, wherein each multi-level memory cell stores an energy level representing two or more bits, each bit comprising two states;
    analyzing the defect data set to generate, for each failed multi-level memory cell, a failed bit location and one or more fail states for the failed bit; and
    classifying a vertical fail pattern that indicates for each multi-level memory cell which of each of the two states for each bit of the multi-level memory cell comprises a fail state;
    whereby after being classified, each vertical fail pattern has three data attributes comprising a vertical fail pattern class, a number of failed bits or a number of fail states, and a sequence of the fail states.

15. The method of claim 14, further comprising generating a defect analysis report of the one or more failed bits.

16. The method of claim 14, further comprising displaying the one or more failed bits.

17. The method of claim 14 wherein the vertical fail pattern comprises one of a single state fail and multi-state fail.

18. The method of claim 17 wherein the multi-state fail is one of a continuous-states fail, discontinuous-states fail, and all-state fail.

19. The method of claim 14 further comprising classifying, for the one or more failed bits, a lateral fail pattern.

20. The method of claim 19 wherein the lateral fail pattern comprises one of a gradual fail pattern, periodic fail pattern, and random fail pattern.

21. The method of claim 14, further comprising generating a three-dimensional classification.

22. The method of claim 14, further comprising producing a correlation.

23. The method of claim 22 wherein the correlation provides at least one of
    correlation of defects to the one or more failed bits,
    correlation of Wafer Electrical Test or Wafer Acceptance Test data to the one or more failed bits,
    correlation of sort parametric data to the one or more failed bits, and
    correlation of in-line measurement data to the one or more failed bits.

24. The method of claim 14, further comprising the providing zonal analysis of memory blocks.

25. The method of claim 14, further comprising the reconfiguring memory device capacity.

26. The method of claim 14, further comprising the implementing redundancy.

27. The method of claim 14, wherein each level of a multi-level memory cell comprises a level of electrical charge that is different than a level of electrical charge of the remaining levels.

28. The method of claim 17 wherein:
the single state fail is defined as a multi-level memory cell that has only one fail state out of all available states in the multi-level memory cell; and
the multi-state fail is defined as a multi-level memory cell that has more than one fail state in the multi-level memory cell.

29. The method of claim 18, wherein:
the continuous-states fail is defined as a multi-level memory cell that has more than one fail state and the more than one fail states are adjacent to each other;
the discontinuous-states fail is defined as a multi-level memory cell that has more than one fail state and at least one of the more than one fail states is not adjacent to at least one other fail state; and
the all-state fail is defined as a cell in which all states fail.

* * * * *